US007826627B2

(12) United States Patent
Radek

(10) Patent No.: US 7,826,627 B2
(45) Date of Patent: Nov. 2, 2010

(54) WAGERING GAME WITH USER VOLUME CONTROL

(75) Inventor: Paul Radek, Naperville, IL (US)

(73) Assignee: WMS Gaming, Inc., Waukegan, IL (US)

( * ) Notice: Subject to any disclaimer, the term of this patent is extended or adjusted under 35 U.S.C. 154(b) by 1200 days.

(21) Appl. No.: 11/276,286

(22) Filed: Feb. 22, 2006

(65) Prior Publication Data

US 2006/0199635 A1 Sep. 7, 2006

Related U.S. Application Data

(60) Provisional application No. 60/656,216, filed on Feb. 25, 2005.

(51) Int. Cl.

*H03G 3/00* (2006.01)
*H04R 1/20* (2006.01)
*H04R 1/02* (2006.01)
*H04R 9/06* (2006.01)

(52) U.S. Cl. ....................... 381/109; 381/104; 381/107; 381/333

(58) Field of Classification Search ................. 381/104, 381/109, 77, 333, 105–108
See application file for complete search history.

(56) References Cited

U.S. PATENT DOCUMENTS 5,710,820 A * 1/1998 Martin et al. ............... 381/321
6,195,438 B1 * 2/2001 Yumoto et al. .............. 381/103
6,968,063 B2 * 11/2005 Boyd .......................... 381/57

* cited by examiner

*Primary Examiner*—Vivian Chin
*Assistant Examiner*—Douglas J Suthers
(74) *Attorney, Agent, or Firm*—Schwegman, Lundberg & Woessner, P.A.

(57) ABSTRACT

A computerized wagering game system includes a gaming module comprising a processor and gaming code which is operable when executed on the processor to present a wagering game on which monetary value can be wagered, and an audio channel coupled to a user volume control module. The user volume control module is operable to adjust a system volume in response to a user input, wherein the system volume is adjusted relative to a master volume setting such that the way in which the system volume is changed relative to the master volume in response to change in the user volume is dependent on the master volume setting.

30 Claims, 4 Drawing Sheets

WAGERING GAME WITH USER VOLUME CONTROL

RELATED APPLICATION

This application claims priority under 35 U.S.C. 119(e) from U.S. Provisional Application Ser. No. 60/656,216 filed Feb. 25, 2005, which application is incorporated herein by reference.

FIELD OF THE INVENTION

The invention relates generally to computerized wagering game machines, and more specifically user volume control in a computerized wagering game machine.

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever. Copyright 2006, WMS Gaming, Inc.

BACKGROUND

Computerized wagering games have largely replaced traditional mechanical wagering game machines such as slot machines, and are rapidly being adopted to implement computerized versions of games that are traditionally played live such as poker and blackjack. These computerized games provide many benefits to the game owner and to the gambler, including greater reliability than can be achieved with a mechanical game or human dealer, more variety, sound, and animation in presentation of a game, and a lower overall cost of production and management.

The elements of computerized wagering game systems are in many ways the same as the elements in the mechanical and table game counterparts in that they must be fair, they must provide sufficient feedback to the game player to make the game fun to play, and they must meet a variety of gaming regulations to ensure that both the machine owner and gamer are honest and fairly treated in implementing the game. Further, they must provide a gaming experience that is at least as attractive as the older mechanical gaming machine experience to the gamer, to ensure success in a competitive gaming market.

Computerized wagering games do not rely on the dealer to facilitate game play and to provide an entertaining game playing environment, but rely upon the presentation of the game and environment generated by the wagering game machine itself. Incorporation of audio and video features into wagering games to present the wagering game, to provide help, and to enhance the environment presented are therefore important elements in the attractiveness and commercial success of a computerized wagering game system. It is not uncommon for audio voices to provide instruction and help, and to provide commentary on the wagering game being played. Music and environmental effects are also played through speakers in some wagering game systems to enhance or complement a theme of the wagering game. These sounds typically accompany video presentation of the wagering game on a screen, which itself often includes animation, video, and three-dimensional graphics as part of presentation of the wagering game.

But, wagering game systems are placed in locations that range from quiet corners of rooms to noisy gaming establishments, and effective audio communication requires the sound be adapted to be loud enough to hear clearly but not be overly loud. The traditional solution of providing a master volume control adjustable by a game technician provides some help, but does not account for changes in the environment over time or changes in the hearing acuity or preferences of the wagering game player. It is therefore desired to be able to adapt the audio volume to ensure that the volume level is appropriate to the environment and user.

SUMMARY

One example embodiment of the invention comprises a computerized wagering game system including a gaming module comprising a processor and gaming code which is operable when executed on the processor to present a wagering game on which monetary value can be wagered. The computerized wagering game further includes an audio channel coupled to a user volume control module operable to adjust a system volume in response to a user input, wherein the system volume is adjusted relative to a master volume setting such that the way in which the system volume is changed relative to the master volume in response to change in the user volume is dependent on the master volume setting.

DETAILED DESCRIPTION

In the following detailed description of example embodiments of the invention, reference is made to specific examples by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit the invention as a whole, and any reference to the invention, its elements, operation, and application do not limit the invention as a whole but serve only to define these example embodiments. The following detailed description does not, therefore, limit the scope of the invention, which is defined only by the appended claims.

One example embodiment of the invention comprises a computerized wagering game system including a gaming module comprising a processor and gaming code which is operable when executed on the processor to present a wagering game on which monetary value can be wagered, and an audio channel coupled to a user volume control module. The user volume control module is operable to adjust a system volume in response to a user input, wherein the system volume is adjusted relative to a master volume setting such that the way in which the system volume is changed relative to the master volume in response to change in the user volume is dependent on the master volume setting.

Figure 1:
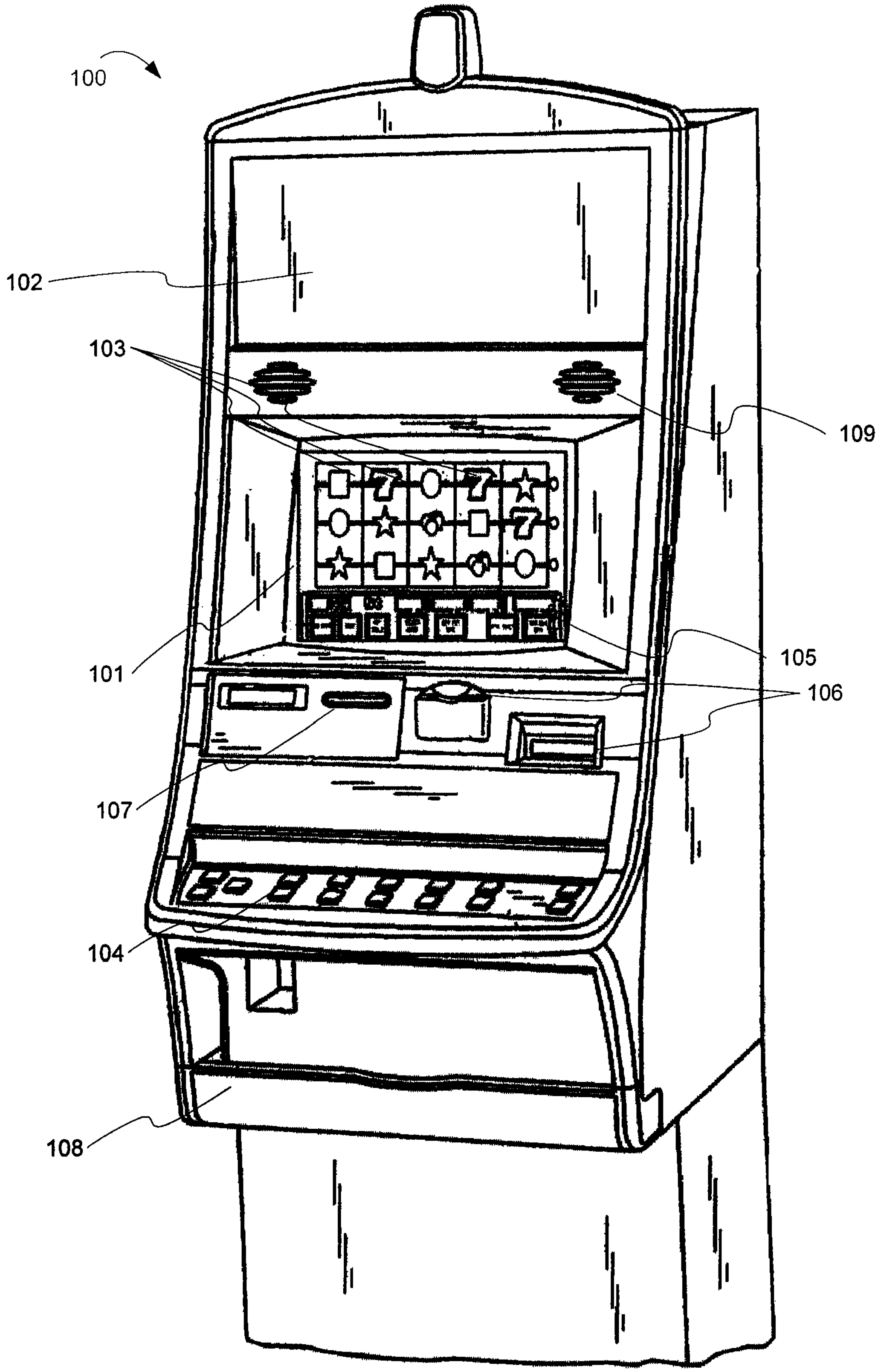
FIG. 1 shows a computerized wagering game machine, as may be used to practice some example embodiments of the present invention.

FIG. 1 illustrates a computerized wagering game machine, as may be used to practice some embodiments of the present invention. The computerized gaming system shown generally at 100 is a video wagering game system, which displays information for at least one wagering game upon which monetary value can be wagered on video display 101. Video display 101 is in various embodiments a CRT display, a plasma display, an LCD display, a surface conducting electron emitter display, or any other type of display suitable for displaying electronically provided display information. In a further embodiment, additional displays such as top-box display 102 are also used. Alternate embodiments of the invention will have other game indicators, such as mechanical reels instead of the video graphics reels shown at 103 that comprise a part of a video slot machine wagering game.

A wagering game is implemented using software within the wagering game system, such as through instructions stored on a machine-readable medium such as a hard disk drive or nonvolatile memory. In some further example embodiments, some or all of the software stored in the wagering game machine is encrypted or is verified using a hash algorithm or encryption algorithm to ensure its authenticity and to verify that it has not been altered. For example, in one embodiment the wagering game software is loaded from nonvolatile memory in a compact flash card, and a hash value is calculated or a digital signature is derived to confirm that the data stored on the compact flash card has not been altered. The wagering game implemented via the loaded software takes various forms in different wagering game machines, including such well-known wagering games as reel slots, video poker, blackjack, craps, roulette, or hold 'em games. The wagering game is played and controlled with inputs such as various buttons 104 or via a touchscreen overlay 105 to video screen 101. In some alternate examples, other devices such as a pull arm used to initiate reel spin in this reel slot machine example are employed to provide other input interfaces to the game player.

Monetary value is typically wagered on the outcome of the games, such as with tokens, coins, bills, or cards that hold monetary value. The wagered value is conveyed to the machine through a changer 106 or a secure user identification module interface 107, and winnings are returned via the returned value card or through the coin tray 108. Sound is also provided through speakers 109, typically including audio indicators of game play, such as reel spins, credit bang-ups, and environmental or other sound effects or music to provide entertainment consistent with a theme of the computerized wagering game. In some further embodiments, the wagering game machine is coupled to a network, and is operable to use its network connection to receive wagering game data, track players and monetary value associated with a player, and to perform other such functions.

The sounds produced by speakers 109 are typically adjusted in volume upon installation of the wagering game system in a wagering facility, so that the sounds produced are appropriate to the environment. For example, a game placed in a busy location near a walkway in a casino may have its master volume level set relatively loud, while the same wagering game machine installed in an airport gate lounge or in a quiet corner or room in a wagering game establishment may have its master volume level set to a relatively low level.

The wagering game in some example embodiments therefore employs a user volume control that functions dependent on the master volume control to allow a user to adjust the volume of the wagering game machine to a certain extent. A user playing a wagering game in the busy casino with a loud master volume setting will be allowed to turn the volume down to a limited degree in one embodiment, while in another embodiment a wagering game player playing a machine with a relatively quiet master volume setting in a high-roller lounge will be permitted to adjust the volume louder to a limited degree.

Figure 2:
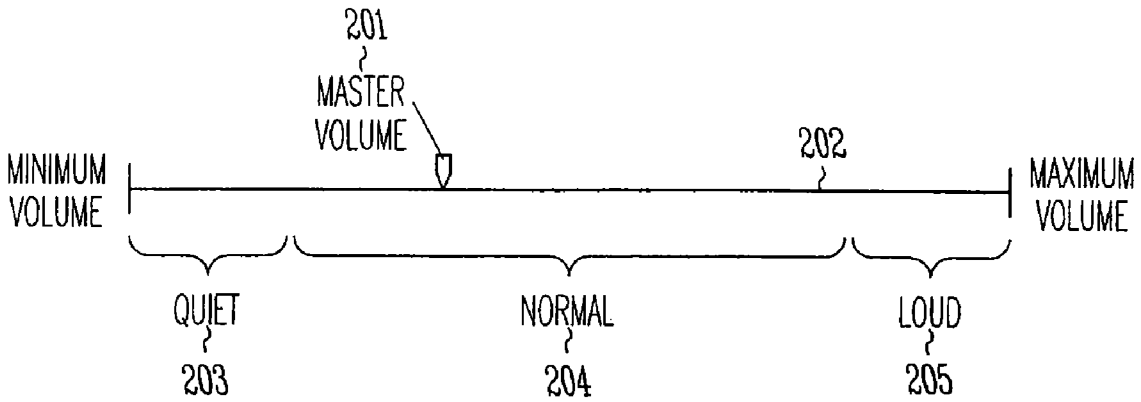
FIG. 2 shows a master volume control level and volume ranges, consistent with some example embodiments of the present invention.

A system consistent with both examples is explained in conjunction with FIG. 2, which illustrates how the user volume control's operation is dependent on the master volume setting in one example embodiment. The master volume 201 is configured upon installation of the wagering game machine. The master volume setting is typically determined by the manager of the slot machines or by other wagering game establishment personnel, and is set by an installer or technician. In one example, the master volume is adjusted via a volume configuration screen that is a part of the configuration and service menu system via the touchscreen, while in other embodiments it is set via other methods such as via a volume knob or potentiometer within the wagering game machine chassis. The master volume is set within a range 202 between the minimum volume level and the maximum volume level, where the minimum volume level is in some embodiments louder than a no-volume setting. The master volume level in this embodiment further falls within one of three volume categories: a quiet master volume level 203, a normal volume range level 204, or within a loud master volume range 205. When the master volume is set at the location shown in FIG. 2, it is set in the normal volume range. With the master volume set in the normal volume range 204, the default or initial user volume setting is set to an intermediate volume level. Adjusting the user volume up increases the overall or system volume relative to the master volume, while adjusting the user volume down or below the default setting causes the system volume to be cut to a level below that of the master volume.

The range of volume adjustment realizable via use of the user volume control is in some embodiments variable, and in others is fixed or is fixed for a certain master volume level or within a certain master volume level range. In one example, the range of volume adjustment achievable with the user volume control is dependent on the master volume setting, such that the louder the master volume control is set the greater the range of volume control is given to the user. When the master volume is set to a low level such as within the quiet master volume region 203, the range of adjustment is relatively low, so allowing the wagering game machine user to increase the volume to a limited degree. On the other hand, when the master volume level is at a relatively high position such as in the loud region 205, the range in which the user may adjust the volume with the user volume control is greater, so that the volume can be turned down a relatively significant amount.

The volume in some embodiments is also adjusted relative to the master volume in different ways depending on the master volume level. In one such example, when the master volume level is in the quiet region 203, the user volume serves only to increase the computerized wagering game system's overall or system volume level above the master volume setting. This ensures not only that the volume is not set below the desired minimum volume level in the volume range 202, but also ensures that the range of adjustability is not limited by setting the master volume too near the minimum volume. Increasing the master volume from a quiet range allows a wagering game player to increase the volume if a location that is typically quiet becomes louder or noisier than typical, or if the wagering game player has difficulty hearing or simply desires that the game be louder while it is being played, but prevents the wagering game player from turning the sound down below the master volume setting where the sounds may become inaudible.

Similarly, when the master volume level is set within the loud region 205, the user volume will not permit the user to further increase the volume level, but serves only to adjust the system volume to a level at or below the master volume level within volume range 202. When the wagering game machine is installed in a relatively noisy environment, and a louder master volume level is chosen, this enables the wagering game player to use the volume control to use the user volume control to turn the volume down, such as when the game player is playing the game during off-hours or simply desires that the game not be as loud as its master volume setting while that particular wagering game player is using the machine.

The starting position of the user volume control is also set in some embodiments to certain positions, so that its operation relative to the master volume control appears logical to the user and to the wagering game system technician or manager. For example, when the master volume setting is in the quiet region and the user volume adjustment serves only to adjust the volume within a range above the master volume setting, the default or initial user volume setting is at the minimum user volume level. This results in the default or initial overall system volume level being at the desired or set master volume setting, while allowing the user to adjust the overall or system volume within a range above the master volume setting by increasing the user volume setting above its default minimum setting. Similarly, when the master volume level is set within the loud region, the default user volume setting is at its loudest, which results in the system or overall volume being the same as the master volume setting. Any adjustment to the user volume is therefore an adjustment down from the default or initial user volume level, and results in a decrease in the overall or system volume level from the master volume setting.

When the master volume setting 201 is in the normal region 204 of the volume range 202, the range of adjustment achievable via the user volume control is set to an intermediate range between the relatively limited range of user volume adjustment when the master volume is set in the quiet region 203 and the relatively large range of user volume adjustment possible when the master volume is in the loud region 205. The user volume default or initial setting is also neither at the quietest or loudest user volume setting, but is at an intermediate level between the quietest and loudest user volume settings. When the user volume is at it default setting and the master volume is in the normal range 204, the resulting overall or system volume is the master volume setting 201. Adjustment of the user volume permits adjustment of the overall system volume above or below the master volume setting 201, such that when the user volume is set below its initial setting the overall system volume is quieter than the master volume, and when the user volume is adjusted to a position above its default setting it results in an overall system volume louder than the master volume setting 201.

The range of adjustment granted to the user is in some embodiments greater than the range of user volume adjustment allowed when the master volume level is in the quiet region 203, and less than the range of user volume adjustment allowed when the master volume is set in the loud region 205. In alternate embodiments, the range of user volume adjustment allowed when the master volume is in the intermediate region is greater than the range of adjustment permitted when the master volume setting is in the quiet or loud regions, because the user can adjust the volume above and below the master volume setting. In one embodiment, this permits the user to adjust the system volume down from the master volume setting at least as far as the user would be able to adjust the system down from the master volume setting were the master volume in the loud range, and allows the user to adjust the system volume up from the master volume setting at least as far as the user would be able to adjust the volume up from the master volume setting were the master volume in the quiet range 203.

Figure 3:
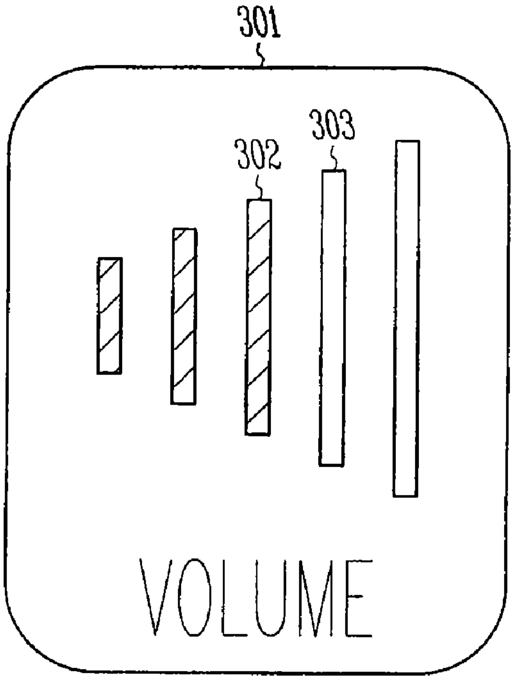
FIG. 3 shows a volume control button with user volume level indicators, consistent with some example embodiments of the present invention.

The user volume is adjusted in various embodiments by touchscreen controls such as touchscreen 105, a volume knob, or a button as is shown at 104 of FIG. 1 and in the example embodiment of FIG. 3. The button 301 comprises a "Volume" label identifying the button's function, and a series of lightable indicator bars 302 and 303. The bars are arranged in order of increasing length, such that the increasing length indicates louder volume as the indicator bars progress from left to right. The indicator bars are lit, such as is shown by indicator bar 302, to show that the user volume level is set to a level at least as high as the lit indicator, while unlit indicator bars such as 303 indicate that the user volume setting is not set as high as the unlit indicator bar. The button shown in FIG. 3 therefore indicates that there are five discrete user volume level settings available, and that the present user volume setting is set at the third loudest of the five settings. In an alternate embodiment, all bars may be lit or none may be lit, resulting in a total of six user volume settings available to the user.

The user changes the volume in this example embodiment by pushing the button, upon which the user volume setting progresses to the next loudest volume setting. For example, if the master volume were set in the quiet region as shown in FIG. 2 and the default user volume level were set to its lowest level such that no indicator bars of FIG. 3 are illuminated, the user volume button would need to be actuated three times to increase the user volume level to the level shown by the lit bars 302 of FIG. 3. Upon reaching the loudest volume level, pressing the volume button again will result in a return to the quietest user volume level in some embodiments, and will result in an incremental decrease in volume in other embodiments.

Although a single button is shown in FIG. 3, other example embodiments of the invention will rely on knobs or dials, such as have been traditionally used to control the volume of a radio. Touchscreen controls are also used in some embodiments to control the user volume, and have the advantage that the touchscreen display can be used to indicate and control the user volume without additional user interface hardware. Still other embodiments of the invention will utilize other methods or mechanisms for providing control of the user volume to the wagering game player.

The user volume setting is in further embodiments not infinite in duration, but reverts from a user selected volume back to the default user volume after a certain period of time or on the occurrence of certain events. For example, one wagering game system embodiment returns from the user-selected user volume setting to a default user volume setting after the credits on the wagering game machine reach zero, and enough time has elapsed to trigger an attract mode in the wagering game machine designed to attract new players.

Figure 4:
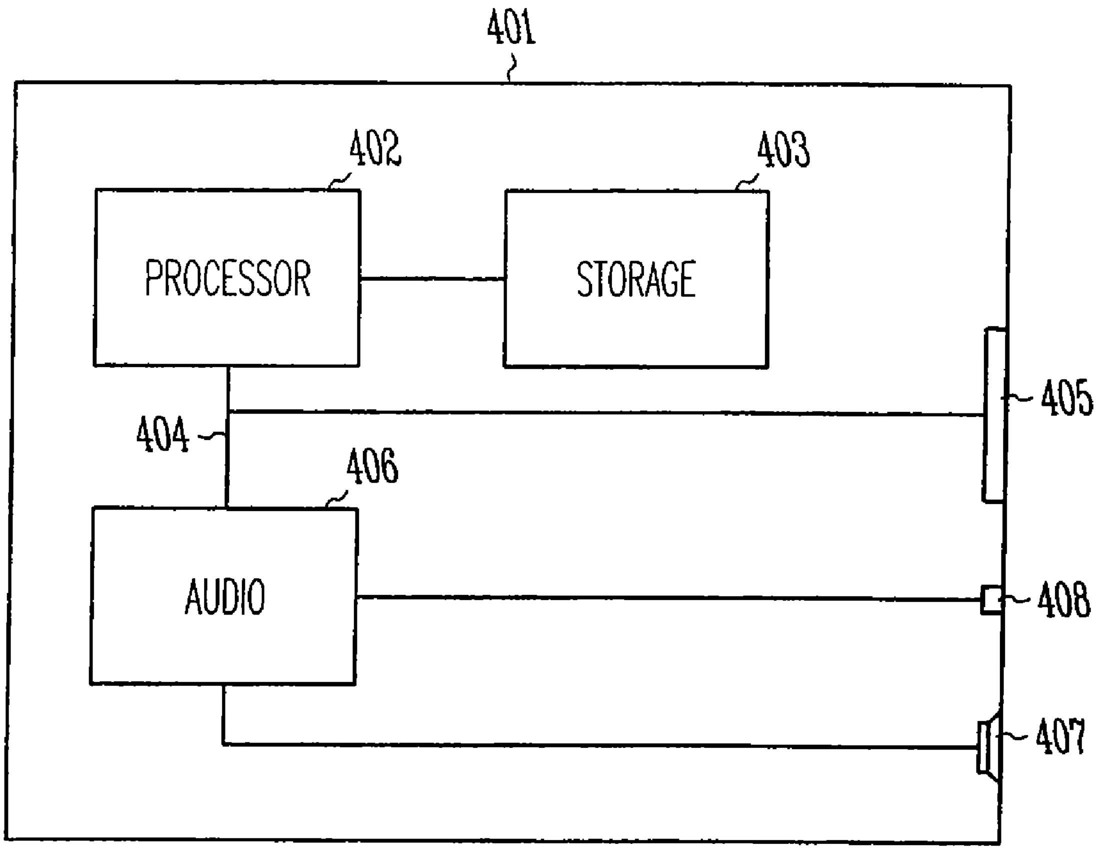
FIG. 4 shows a block diagram of a computerized wagering game system having a user volume setting feature, consistent with some example embodiments of the present invention.

A block diagram of a wagering game system 401 is shown in FIG. 4, such as may be used to practice some embodiments of the invention. The wagering game system 401 has a processor 402 that executes code it loads from nonvolatile storage 403, such as a hard disk drive or nonvolatile memory such as a CompactFlash card. Program material is loaded from the nonvolatile storage and its security is verified by calculating a hash value or confirming a digital signature, and the program is executed on the processor 402 to cause the system to conduct a wagering game upon which monetary value can be wagered.

The processor of the wagering game system is coupled to a system bus 404, which links it to components such as a touchscreen display 405, and an audio module 406 that is operable to receive instructions to play sounds through one or more speakers 407, and to receive other data through touchscreen 405 or via another user hardware interface such as button 408.

In operation, the computerized wagering game system conducts the computerized wagering game, and presents the user with a user volume control. The user's interface to the user volume control is in one embodiment achieved through information displayed on a touchscreen and inputs received through the touchscreen display 405, and in another embodiment is achieved through a button 408 such as the button of FIG. 3. The user operates the button 408 or the touchscreen to adjust the user volume setting, which serves to adjust the overall system volume relative to a master volume setting as was explained in greater detail in the description of FIG. 2.

Figure 5:
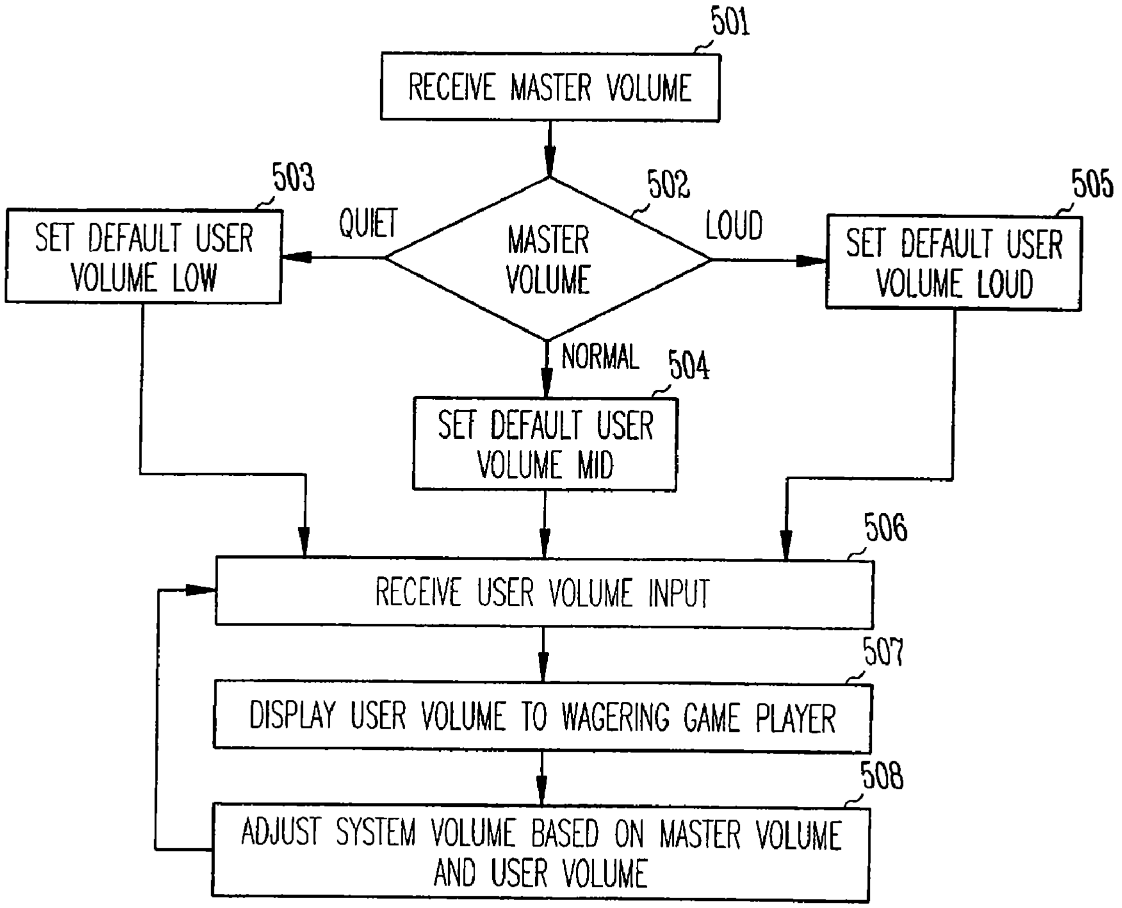
FIG. 5 shows a flowchart of a method of practicing an example embodiment of the present invention.

This method is illustrated in the flowchart of FIG. 5, which shows generally how one example embodiment uses the user volume control to adjust the wagering game system's system volume. At 501, a master volume is received, such as is set by a game technician. In some embodiments, the master volume setting automatically changes based on factors such as the time of day or on perceived environmental noise, or is received via a network connection. The master volume setting is determined at 502 to be in either the quiet, normal, or loud range as are shown and described in FIG. 2. If the master volume setting is quiet, the default user volume is set to a lowest level at 503, if the master volume setting is normal, the default user volume is set to a mid-level at 504, and if the master volume setting is high the default user volume is set to a loud level at 505. Once the user changes the user volume setting, such as by turning a dial, pressing a button, or using touchscreen controls, the user volume input is received at 506. The changed user volume setting is displayed to the wagering game player at 507, and the system volume is adjusted based on the master volume setting and the user volume setting at 508. Steps 506-508 are repeated upon a change in the user volume setting, so that changes in the user volume are displayed and reflected in a change in the system volume.

These examples illustrate how a user volume control can be implemented to ensure that the volume of a wagering game machine is appropriate to the environment, and to the specific wagering game player presently using the wagering game system. Modification from a preselected master volume level ensures that the overall system volume remains within a predetermined range of volumes, while allowing the individual game player to have some degree of control over the system volume by use of a user volume control setting. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A computerized wagering game system, comprising:

a gaming module comprising a processor and gaming code which is operable when executed on the processor to present a wagering game on which monetary value can be wagered, and further comprising at least one audio channel operable to produce sound; and a user volume control module operable to set a user volume and to adjust a system volume in response to a user input, wherein the system volume is adjusted relative to a master volume setting, the master volume divided into a plurality of ranges, such that the way in which the system volume is changed relative to the master volume in response to change in the user volume is dependent on the master volume setting and a range of the plurality of ranges of the master volume, the range determined by the master volume setting.

2. The computerized wagering game system of claim 1, wherein the user volume adjusts the system volume only above the master volume level when the master volume is at a relatively low setting, the relatively low setting within a first range of the plurality of ranges.

3. The computerized wagering game system of claim 1, wherein the user volume adjusts the system volume only below the master volume level when the master volume level is at a relatively high setting, the relatively high setting within a second range of the plurality of ranges.

4. The computerized wagering game system of claim 1, wherein the user volume adjusts the system volume above or below the master volume setting when the master volume level is at a medium setting, the medium setting within a third range of the plurality of ranges.

5. The computerized wagering game system of claim 1, wherein the user volume is adjusted via a touchscreen control.

6. The computerized wagering game system of claim 1, wherein the user volume is adjusted via a button or switch.

7. The computerized wagering game system of claim 1, further comprising displaying the user volume to the wagering game player.

8. The computerized wagering game system of claim 1, wherein the range of user volume control is relatively small when the master volume is at a relatively quiet level.

9. The computerized wagering game system of claim 1, wherein the user volume control module comprises software executing on a processor.

10. A method of controlling volume in a computerized wagering game system, comprising:

receiving a master volume level for a master volume divided into a plurality of ranges;

receiving a user volume level; and adjusting a system volume derived from the master volume in response to the user volume level such that the way in which the system volume is changed relative to the master volume in response to change in the user volume is dependent on the master volume level and a range of the plurality of ranges of the master volume, the range determined by the master volume level.

11. The method of claim 10, further comprising setting a default user volume level that is dependent on the master volume level.

12. The method of claim 11, wherein the default user volume is set low when the master volume is within a quiet range of the plurality of ranges, and is set high when the master volume is within a loud range of the plurality of ranges.

13. The method of claim 10, further comprising displaying the user volume level to a wagering game player.

14. The method of claim 10, wherein the user volume adjusts the system volume only above the master volume level when the master volume is at a relatively low setting, the relatively low setting within a first range of the plurality of ranges.

15. The method of claim 10, wherein the user volume adjusts the system volume only below the master volume level when the master volume level is at a relatively high setting, the relatively high setting within a second range of the plurality of ranges.

16. The method of claim 10, wherein the user volume adjusts the system volume above or below the master volume setting when the master volume level is at a medium setting, the medium setting within a third range of the plurality of ranges.

17. The method of claim 10, wherein the range of user volume control is relatively small when the master volume is at a relatively quiet level.

18. The method of claim 10, wherein the range of user volume control is relatively large when the master volume is at a relatively loud level.

19. The method of claim 10, wherein the user volume is adjusted via a touchscreen control, a button, or a switch.

20. The method of claim 10, further comprising conducting a wagering game upon which monetary value can be wagered.

21. A non-transitory machine-readable medium with instructions stored thereon, the instructions when executed operable to cause a computerized wagering game system to:

receive a master volume level for a master volume divided into a plurality of ranges;

receive a user volume level; and adjusting a system volume derived from the master volume in response to the user volume level such that the way in which the system volume is changed relative to the master volume in response to change in the user volume is dependent on the master volume level and a range of the plurality of ranges of the master volume, the range determined by the master volume level.

22. The non-transitory machine-readable medium of claim 21, the instructions when executed further operable to cause the computerized wagering game system to set a default user volume level that is dependent on the master volume level.

23. The non-transitory machine-readable medium of claim 22, wherein the default user volume is set low when the master volume is within a quiet range of the plurality of ranges, and is set high when the master volume is within a loud range of the plurality of ranges.

24. The non-transitory machine-readable medium of claim 21, the instructions when executed further operable to cause the computerized wagering game system to display the user volume level to a wagering game player.

25. The non-transitory machine-readable medium of claim 21, wherein the user volume adjusts the system volume only above the master volume level when the master volume is at a relatively low setting, the relatively low setting within a first range of the plurality of ranges.

26. The non-transitory machine-readable medium of claim 21, wherein the user volume adjusts the system volume only below the master volume level when the master volume level is at a relatively high setting, the relatively high setting within a second range of the plurality of ranges.

27. The non-transitory machine-readable medium of claim 21, wherein the user volume adjusts the system volume above or below the master volume setting when the master volume level is at a medium setting, the medium setting within a third range of the plurality of ranges.

28. The non-transitory machine-readable medium of claim 21, wherein the range of user volume control is relatively small when the master volume is at a relatively quiet level.

29. The non-transitory machine-readable medium of claim 21, wherein the user volume is adjusted via a touchscreen control, a button, or a switch.

30. The non-transitory machine-readable medium of claim 21, the instructions when executed further operable to cause the computerized wagering game system to conduct a wagering game upon which monetary value can be wagered.

* * * * *